United States Patent
Jinno et al.

(10) Patent No.: US 10,580,648 B2
(45) Date of Patent: Mar. 3, 2020

(54) SEMICONDUCTOR DEVICE AND METHOD OF MANUFACTURING SEMICONDUCTOR DEVICE

(71) Applicants: FLOSFIA INC., Kyoto (JP); KYOTO UNIVERSITY, Kyoto (JP)

(72) Inventors: Riena Jinno, Kyoto (JP); Shizuo Fujita, Kyoto (JP); Kentaro Kaneko, Kyoto (JP); Tokiyoshi Matsuda, Kyoto (JP); Takashi Shinohe, Kyoto (JP); Toshimi Hitora, Kyoto (JP)

(73) Assignees: FLOSFIA INC., Kyoto (JP); KYOTO UNIVERSITY, Kyoto (JP)

( * ) Notice: Subject to any disclaimer, the term of this patent is extended or adjusted under 35 U.S.C. 154(b) by 0 days.

(21) Appl. No.: 16/120,914

(22) Filed: Sep. 4, 2018

(65) Prior Publication Data
US 2019/0074178 A1 Mar. 7, 2019

(30) Foreign Application Priority Data

Sep. 4, 2017 (JP) .................... 2017-169149

(51) Int. Cl.
*H01L 21/02* (2006.01)
*H01L 29/66* (2006.01)
(Continued)

(52) U.S. Cl.
CPC ........ *H01L 21/02565* (2013.01); *C23C 16/40* (2013.01); *C23C 16/56* (2013.01);
(Continued)

(58) Field of Classification Search
None
See application file for complete search history.

(56) References Cited

U.S. PATENT DOCUMENTS

| | | | |
|---|---|---|---|
| 2012/0138956 A1 | 6/2012 | Shimizu et al. | |
| 2015/0179445 A1* | 6/2015 | Sasaki | C30B 23/025 257/43 |
| 2015/0325659 A1* | 11/2015 | Hitora | H01L 21/0257 257/43 |

FOREIGN PATENT DOCUMENTS

| | | |
|---|---|---|
| JP | 2012-119586 | 6/2012 |
| JP | 2017-7871 | 1/2017 |
| WO | 2013/035841 | 3/2013 |

OTHER PUBLICATIONS

Rustum Roy et al., "Polymorphism of $Ga_2O_3$ and the, System $Ga_2O_3$-$H_2O$", Feb. 5, 1952, vol. 74, pp. 719-722.
(Continued)

*Primary Examiner* — Herve-Louis Y Assouman
(74) *Attorney, Agent, or Firm* — Wenderoth, Lind & Ponack, L.L.P.

(57) ABSTRACT

In a first aspect of a present inventive subject matter, a semiconductor device includes a first semiconductor layer that is an electron-supply layer containing as a major component a first semiconductor crystal with a metastable crystal structure; and a second semiconductor layer that is an electron-transit layer containing as a major component a second semiconductor crystal with a hexagonal crystal structure. The first semiconductor crystal contained in the first semiconductor layer is different in composition from the second semiconductor crystal comprised in the second semiconductor layer.

18 Claims, 5 Drawing Sheets

(51) Int. Cl.
*H01L 29/778* (2006.01)
*C30B 33/02* (2006.01)
*H01L 29/04* (2006.01)
*H01L 29/737* (2006.01)
*H01L 29/24* (2006.01)
*C23C 16/40* (2006.01)
*C23C 16/56* (2006.01)
*C30B 25/02* (2006.01)
*C30B 29/16* (2006.01)
*H01L 29/08* (2006.01)

(52) U.S. Cl.
CPC ............. *C30B 25/02* (2013.01); *C30B 29/16* (2013.01); *C30B 33/02* (2013.01); *H01L 21/0242* (2013.01); *H01L 21/0262* (2013.01); *H01L 21/02414* (2013.01); *H01L 21/02428* (2013.01); *H01L 21/02483* (2013.01); *H01L 21/02598* (2013.01); *H01L 29/04* (2013.01); *H01L 29/0891* (2013.01); *H01L 29/24* (2013.01); *H01L 29/66969* (2013.01); *H01L 29/7371* (2013.01); *H01L 29/7786* (2013.01); *H01L 29/7787* (2013.01)

(56) References Cited

OTHER PUBLICATIONS

Jun Liang Zhao et al., "UV and Visible Electroluminescence From a Sn:$Ga_2O_3$/n$^+$Si Heterojunction by Metal-Organic Chemical Vapor Deposition", IEEE Transactions on Electron Devices, vol. 58, No. 5, May 2011, pp. 1447-1451.

Yuichi Oshima et al., "Epitaxial Growth of Phase-Pure ε-$Ga_2O_3$ by Halide Vapor Phase Epitaxy", Journal of Applied Physics 118, 085301, 2015, pp. 085301-1-085301-5.

Hiroyuki Nishinaka et al., "Heteroepitaxial Growth of ε-$Ga_2O_3$ Thin Films on Cubic (111) MgO and (111) Yttria-Stabilized Zirconia Substrates by Mist Chemical Vapor Deposition", Japanese Journal of Applied Physics 55, 1202BC, published online Nov. 11, 2016, pp. 1202BC-1-1202BC-4.

Kohei Sasaki et al.,"Si-Ion Implantation Doping in β-$Ga_2O_3$ and Its Application to Fabrication of Low-Resistance Ohmic Contacts", Applied Phys. Express 6, 2013, 086502, The Japan Society of Applied Physics, pp. 086502-1-086502-4.

\* cited by examiner

RMS : 0.49 nm

SEMICONDUCTOR DEVICE AND METHOD OF MANUFACTURING SEMICONDUCTOR DEVICE

CROSS-REFERENCE TO RELATED APPLICATION

This application is a new U.S. patent application that claims priority benefit of Japanese patent application No. 2017-169149 filed on Sep. 4, 2017, the disclosures of which are incorporated herein by reference in its entirety.

BACKGROUND OF THE INVENTION

Field of the Invention

The present disclosure relates to a semiconductor device. Also, the present disclosure relates to a method to manufacture a semiconductor device.

Description of the Related Art

It is open to the public that a compound semiconductor device including a substrate, an electron transit layer formed over the substrate; an electron supply layer formed over the electron transit layer, and a buffer layer formed between the substrate and the electron transit layer and including $Al_xGa_{1-x}N$ ($0 \leq X \leq 1$), wherein the x value represents a plurality of maximums and a plurality of minimums in the direction of the thickness of the buffer layer, and the variation of x in any area having a 1 nm thickness in the buffer layer is 0.5 or less (For reference, see unexamined Japanese patent publication No. JP2012-119586).

If a GaN-based high electron mobility transistor (HEMT) is used as a switching device of a power source, such a device is expected to reduce on-resistance and to have a higher breakdown voltage, however, there seem to be some problems: it is difficult to obtain crystalline GaN substrates in good quality, which tend to affect high-frequency characteristics of the transistor, also, the size of a semiconductor chip is required to be increased to obtain a higher breakdown voltage; furthermore, an electron-transit layer of a GaN-based HEMT is usually formed by use of metal-organic chemical vapor deposition (MOCVD) method, which requires a vacuum system that tends to increase cost, for example.

On the other hand, Gallium oxide ($Ga_2O_3$) exhibits wide band gap, which is wider than GaN, and attracts more attention as a potential semiconductor material for semiconductor devices. The band gap energy of $Ga_2O_3$ has been reported to be 4.8 to 53 eV. Also, $Ga_2O_3$ is known as a transparent semiconductor material, which hardly absorb visible light and/or ultraviolet light. Accordingly, $Ga_2O_3$ is considered to be a promising material for power devices, optical devices and electronic devices, some of which are operated and/or related to ultraviolet and/or deep ultraviolet region.

A light-emitting diode (LED) including an Sn-doped $Ga_2O_3$ film fabricated by MOCVD is open to the public (For reference, see NPL2 Jun Liang Zhao et al. "UV and Visible Electroluminescence From a $Sn:Ga_2O_3/n^+$—Si Heterojunction by Metal-Organic Chemical Vapor Deposition", IEEE TRANSACTIONS ON ELECTRON DEVICES, VOL. 58, NO. 5 May 2011).

Also, $Ga_2O_3$ is known to possess five different polymorphs including α-, β-, γ-, δ-, and ε-phases (for reference, see NPL1: Rustum Roy et al, "Polymorphism of $Ga_2O_3$ and the System $Ga_2O_3$—$H_2O$"). Among these five polymorphs, β-$Ga_2O_3$ is believed to be thermodynamically the most stable. Gallium oxide ($Ga_2O_3$) exhibits wide band gap and attracts more attention as a potential semiconductor material for semiconductor devices.

Furthermore, a $Ga_2O_3$ HEMT including an i-type β-$Ga_2O_3$ single crystal film, an n-type β-$(Al_xGa_{1-x})_2O_3$ single crystal film formed on the i-type β-$Ga_2O_3$ single crystal film is open to the public (For reference, see international patent publication No, WO2013/035841). The $Ga_2O_3$ HEMT is composed of β-$(Al_xGa_{1-x})_2O_3$ crystal ($0<x\leq0.6$) containing a group IV element; a source electrode and a drain electrode, which are formed on the n-type β-$(Al_xGa_{1-x})_2O_3$ single crystal film and a gate electrode formed on the n-type β-$(Al_xGa_{1-x})_2O_3$ single crystal film and a gate electrode formed on the n-type β-$(Al_xGa_{1-x})_2O_3$ single crystal film between the source electrode and the drain electrode.

β-$Ga_2O_3$ known to have β-Gallia structure, which is different from crystal structures generally used in electronic materials and devices, may not be always suitable for electronic materials and devices.

Compared with the number of researches of β-$Ga_2O_3$, the number of the researches of ε-$Ga_2O_3$ is still small, but it is suggested that a single crystal of ε-$Ga_2O_3$ is formed by HVPE (Halide Vapor Phase Epitaxy) method (For reference, see unexamined Japanese patent publication No. 2017-07871, and NPL3: Yuichi OSHIMA, et al., "Epitaxial growth of phase-pure ε-$Ga_2O_3$ by halide vapor phase epitaxy", Journal of applied physics 118, 085301, 2015). Also, it is suggested that ε-$Ga_2O_3$ thin films are formed by mist Chemical Vapor Deposition (CVD) (see NPL4: Hiroyuki NISHINAKA, et al. "Heteroepitaxial growth of ε-$Ga_2O_3$ thin films on cubic (111) MgO and (111) yttria-stabilized zirconia substrates by mist chemical vapor deposition", published online Nov. 11, 2016).

SUMMARY OF THE INVENTION

In a first aspect of a present inventive subject matter, a semiconductor device includes a first semiconductor layer that is an electron-supply layer containing as a major component a first semiconductor crystal with a metastable crystal structure; and a second semiconductor layer that is an electron-transit layer containing as a major component a second semiconductor crystal with a hexagonal crystal structure. The first semiconductor crystal contained in the first semiconductor layer is different in composition from the second semiconductor crystal contained in the second semiconductor layer.

According to an embodiment of a semiconductor device of a present inventive subject matter, it is suggested that the metastable crystal structure of the first semiconductor crystal contained in the first semiconductor layer is a trigonal crystal structure.

Also, according to an embodiment of a semiconductor device of a present inventive subject matter, it is suggested that the metastable crystal structure of the first semiconductor crystal contained in the first semiconductor layer is a hexagonal crystal structure.

It is suggested that the metastable crystal structure contained in the first semiconductor layer contains gallium.

According to an embodiment of a semiconductor device of a present inventive subject matter, the metastable crystal structure contained in the first semiconductor layer contains gallium and further contains aluminum.

According to an embodiment of a semiconductor device of a present inventive subject matter, a semiconductor device includes a first semiconductor layer containing as a major component a first semiconductor crystal with a metastable crystal structure; and a second semiconductor layer containing as a major component a second semiconductor crystal with a hexagonal crystal structure. The first semiconductor crystal contained in the first semiconductor layer is different from the second semiconductor crystal contained in the second semiconductor layer in composition. The second semiconductor crystal contained in the second semiconductor layer contains gallium.

Also, according to an embodiment of a semiconductor device of a present inventive subject matter, the second semiconductor crystal contained in the second semiconductor layer contains ε-$Ga_2O_3$.

Furthermore, according to an embodiment of a semiconductor device of a present inventive subject matter, the second semiconductor crystal contained in the second semiconductor layer contains a mixed crystal containing ε-$Ga_2O_3$.

In a second aspect of a present inventive subject matter, a method of manufacturing a semiconductor device includes: forming a first semiconductor layer containing as a major component a first semiconductor crystal with a metastable crystal structure by use of a mist chemical vapor deposition method; and forming a second semiconductor layer containing as a major component a second semiconductor crystal with a hexagonal crystal structure by use of the mist chemical vapor deposition method. The second semiconductor crystal is different from the first semiconductor crystal in composition.

In a third aspect of a present inventive subject matter, a method of manufacturing a semiconductor device includes: forming a first semiconductor layer containing as a major component a first semiconductor crystal with a metastable crystal structure; and forming a second semiconductor layer containing as a major component a second semiconductor crystal with a hexagonal crystal structure on the first semiconductor layer. The second semiconductor crystal is different from the first semiconductor crystal in composition.

It is suggested that the method of manufacturing a semiconductor device may further include annealing the first semiconductor layer.

Also, it is suggested that a step terrace structure may be formed on a surface of the first semiconductor layer by the annealing the first semiconductor layer.

DETAILED DESCRIPTION OF EMBODIMENTS

Figure 1:
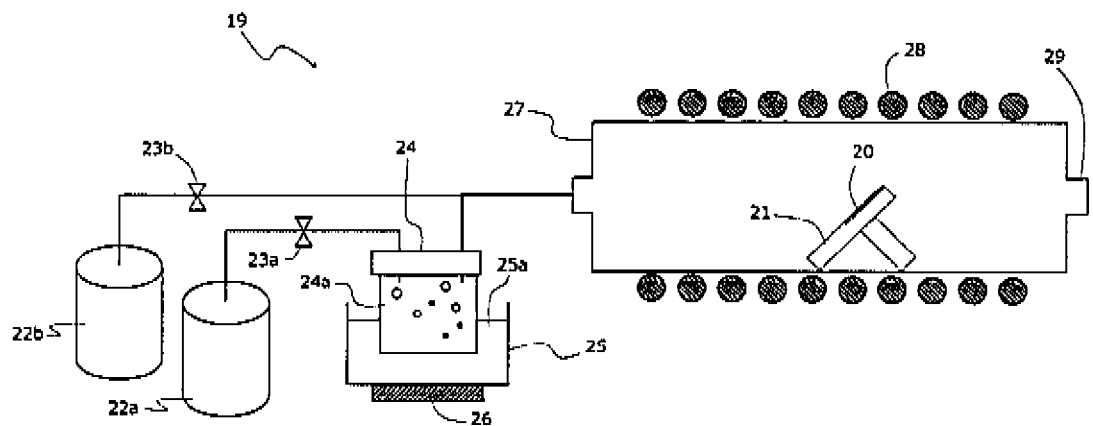
FIG. 1 shows a schematic view of a mist chemical vapor deposition (CVD) apparatus that is used in embodiments of a method for producing a semiconductor layer according to a present inventive subject matter.

The terminology used herein is for the purpose of describing particular embodiments only and is not intended to be limiting of the subject matter. As used herein, the singular forms "a", "an" and "the" are intended to include the plural forms as well, unless the context clearly indicates otherwise.

As used herein, the term "and/or" includes any and all combinations of one or more of the associated listed items.

As illustrated in the figures submitted herewith, some sizes of structures or portions may be exaggerated relative to other structures or portions for illustrative purposes. Relative terms such as "below" or "above" or "upper" or "lower" may be used herein to describe a relationship of one element, layer or region to another element, layer or region as illustrated in the figures. It will be understood that these terms are intended to encompass different orientations of a layer, a device, and/or a system in addition to the orientation depicted in the figures.

In a first aspect of a present inventive subject matter, a semiconductor device includes a first semiconductor layer containing as a major component a first semiconductor crystal with a metastable crystal structure; and a second semiconductor layer containing as a major component a second semiconductor crystal with a hexagonal crystal structure. The first semiconductor crystal contained in the first semiconductor layer is different from the second semiconductor crystal contained in the second semiconductor layer in composition.

According to an embodiment of a semiconductor device of a present inventive subject matter, the semiconductor device includes a first semiconductor layer that includes an electron-supply layer and a second semiconductor layer that includes an electron-transit layer.

According to an embodiment of a semiconductor device of a present inventive subject matter, it is suggested that the metastable crystal structure of the first semiconductor crystal contained in the electron-supply layer is a trigonal crystal structure.

Also, according to an embodiment of a semiconductor device of a present inventive subject matter, it is suggested that the metastable crystal structure of the first semiconductor crystal contained in the first semiconductor layer is a hexagonal crystal structure.

It is suggested that the metastable crystal structure contained in the first semiconductor layer contains gallium.

According to an embodiment of a semiconductor device of a present inventive subject matter, the metastable crystal structure contained in the first semiconductor layer contains gallium and further contains aluminum.

According to an embodiment of a semiconductor device of a present inventive subject matter, a semiconductor device includes a first semiconductor layer containing as a major component a first semiconductor crystal with a metastable crystal structure; and a second semiconductor layer containing as a major component a second semiconductor crystal with a hexagonal crystal structure. The first semiconductor crystal contained in the first semiconductor layer is different from the second semiconductor crystal contained in the second semiconductor layer in composition. The second semiconductor crystal contained in the second semiconductor layer contains gallium.

Also, according to an embodiment of a semiconductor device of a present inventive subject matter, the second semiconductor crystal contained in the second semiconductor layer contains ε-$Ga_2O_3$.

Furthermore, according to an embodiment of a semiconductor device of a present inventive subject matter, the second semiconductor crystal contained in the second semiconductor layer contains a mixed crystal containing ε-$Ga_2O_3$.

According to an embodiment of a semiconductor device of a present inventive subject matter, the semiconductor device includes a first semiconductor layer containing as a major component a first semiconductor crystal with a metastable crystal structure; and a second semiconductor layer containing as a major component a second semiconductor crystal with a hexagonal crystal structure. The first semiconductor crystal contained in the first semiconductor layer contains gallium, and the second semiconductor crystal contained in the second semiconductor layer contains ε-$Ga_2O_3$. The first semiconductor crystal contained in the first semiconductor layer may further contain aluminum.

According to an embodiment of a semiconductor device of a present inventive subject matter, the semiconductor device includes a first electrode electrically connected to the first semiconductor layer; and a second electrode electrically connected to the first semiconductor layer. The semiconductor device may be a power device.

Also, according to an embodiment of a semiconductor device of a present inventive subject matter, the semiconductor device may be a high frequency device.

Furthermore, according to an embodiment of a semiconductor device of a present inventive subject matter, the semiconductor device may be a high-electron-mobility transistor.

Also, according to an embodiment of a semiconductor device of a present inventive subject matter, the semiconductor device may be a heterojunction bipolar transistor.

According to a second aspect of a present inventive subject matter, a method of manufacturing a semiconductor device includes: forming a first semiconductor layer containing as a major component a first semiconductor crystal with a metastable crystal structure; and forming a second semiconductor layer containing as a major component a second semiconductor crystal with a hexagonal crystal structure on the first semiconductor layer.

Also, it is suggested that the method may further include annealing the first semiconductor layer. As a result of annealing the first semiconductor layer, the first semiconductor layer obtains a step terrace structure on a surface of the first semiconductor layer.

According to a third aspect of a present inventive subject matter, a method of manufacturing a semiconductor device includes: forming a first semiconductor layer containing as a major component a first semiconductor crystal with a metastable crystal structure by use of a mist chemical vapor deposition (CVD) method; and forming a second semiconductor layer containing as a major component a second semiconductor crystal with a hexagonal crystal structure by use of the mist CVD method. The second semiconductor crystal is suggested to be different from the first semiconductor crystal in composition.

Furthermore, it is suggested that the first semiconductor layer includes at least an electron-supply layer and the second semiconductor layer include at least an electron-transit layer.

According to an embodiment of a method for manufacturing a semiconductor device, the method includes forming an electron-supply layer as a first semiconductor layer; and forming an electron-transit layer as a second semiconductor layer on the first semiconductor layer. The electron-supply layer may be formed by use of the mist CVD method. Also, the electron-transit layer may be formed on the electron-supply layer by use of the mist CVD method.

By use of the mist CVD method, the electron-supply layer may be formed by turning a raw-material solution of the electron-supply layer into atomized droplets, carrying the atomized droplets of the raw-material solution of the electron-supply layer by use of a carrier gas onto a base, and causing a thermal reaction of the atomized droplets of the raw-material solution of the electron-supply layer adjacent to the base to form the electron-supply layer on the base.

Also, by use of the mist CVD method, the electron-transit layer may be formed by turning a raw-material solution of the electron-transit layer into atomized droplets, carrying the atomized droplets of the raw-material solution of the electron-transit layer by use of a carrier gas onto a base, and causing a thermal reaction of the atomized droplets of the raw-material solution of the electron-transit layer adjacent to first semiconductor layer on the base to form the electron-transit layer on the first semiconductor layer.

(Base)

As a base, the base is not particularly limited as long as the base is able to support a semiconductor layer to be formed on the base. Herein, "a semiconductor layer" and/or "the semiconductor layer" may be the first semiconductor layer and/or the second semiconductor layer. Furthermore, a material for the base is not particularly limited as long as an object of the present inventive subject matter is not interfered with, and also, the material may be a known one. The base may be made of a material of an organic compound. Also, the base may be made of a material of an inorganic compound. The base may have a plate shape. Examples of the shape of the base further include a circular plate shape, a shape of fiber, a shape of a stick, a shape of a round pillar, a shape of a square pillar, a shape of a tube, a shape of a spiral, a shape of a spiral, a shape of a sphere and a shape of a ring. According to embodiments of a present inventive subject matter, the base is a substrate. According to embodiments of a present inventive subject matter, the base is preferably a crystalline substrate.

(Crystalline Substrate)

As a crystalline substrate, the crystalline substrate is not particularly limited, however, preferable examples of the crystalline substrate include a crystalline substrate with ε-phase crystal structure that is formed on at least a part of a principal plane of the crystalline substrate, a crystalline substrate with a trigonal crystal structure that is formed on at least a part of a principal plane of the crystalline substrate, a crystalline substrate with a hexagonal crystal structure that is formed on at least a part of a principal plane of the crystalline substrate and a crystalline substrate with a β-phase crystalline structure that is formed on at least a part of a principal plane of the substrate.

According to an embodiment of a present inventive subject matter, the crystalline substrate preferably includes the crystal structure on an entire surface of the principal plane of the crystalline substrate.

Examples of the crystalline substrate with the ε-phase crystal structure include a ε-$Ga_2O_3$ substrate. Also, examples of the crystalline substrate with the trigonal crystal structure include an α-$Al_2O_3$ (sapphire) substrate and an α-$Ga_2O_3$ substrate. Furthermore, examples of the crystalline substrate with the hexagonal crystal structure include a silicon carbide (SIC) substrate, a zinc oxide (ZnO) substrate, and gallium nitride (GaN) substrate. According to embodiments of a present inventive subject matter, the crystalline substrate preferably includes a trigonal crystal structure, and a sapphire substrate is preferable. The crystalline substrate may include an off-angle. The shape of the crystalline substrate is not particularly limited as long as the crystalline substrate has a plate shape and is able to support a layer (film) to be formed on. The crystalline substrate may be an electrically-insulating substrate. Also, the crystalline substrate may be a semiconductor substrate. Furthermore, the crystalline substrate may be an electrically-conductive substrate. The shape of the crystalline substrate may be, for example, a circular shape. The circular shape may include shapes of a circle, a semicircle and/or an ellipse. The shape of the crystalline substrate may be, for example, a polygonal shape. The polygonal shape may include a triangle, a square, a rectangle, a pentagon, a hexagon, a heptagon, an octagon and a nonagon. Accordingly, a crystalline substrate according to an embodiment of a present inventive subject matter, the shape of the crystalline substrate would be selectable to form a semiconductor layer (film) in a desired shape on the crystalline substrate.

According to an embodiment of a present inventive subject matter, the substrate may include a buffer layer on top of the substrate. In an embodiment of a method of a present inventive subject matter, the buffer layer is not particularly limited but preferably contains at least one selected from among gallium, aluminum, and indium, but further preferably the buffer layer contains gallium. In an embodiment of a method of producing a crystalline film of a present inventive subject matter, the buffer layer further preferably contains gallium oxide or a mixed crystal of gallium oxide. The crystal structure of the buffer layer is not particularly limited and a known method may be used. Also, a buffer layer may be formed similarly to forming a semiconductor layer.

(Forming Atomized Droplets from a Raw Material Solution)

A raw material solution is turned into atomized droplets floating in a space of a container of a mist generator. The raw material solution may be turned into atomized droplets by a known method, and the method is not particularly limited, however, according to an embodiment of a present inventive subject matter, the raw material solution is preferably turned into atomized droplets by ultrasonic vibration. Atomized droplets including mist particles and obtained by using ultrasonic vibration and floating in the space have the initial velocity that is zero. Since atomized droplets floating in the space are carriable as a gas, the atomized droplets floating in the space are preferable to avoid damage caused by the collision energy without being blown like a spray. The size of droplets is not limited to a particular size, and may be a few mm, however, the size of atomized droplets is preferably 50 μm or less. The size of droplets is preferably in a range of 0.1 μm to 10 μm.

(Raw-material Solution)

The raw-material solution is not particularly limited as long as the semiconductor layer is able to be formed from the raw-material solution by a mist CVD method, and the raw-material solution may contain an organic material and/or inorganic material, however, in embodiments of a method of manufacturing a semiconductor device of a present inventive subject matter, the raw-material solution preferably contains a metal and/or a metal compound. The metal contained in the raw-material solution is not particularly limited, however, the metal may be preferably at least one selected from among gallium, aluminum, and indium.

According to an embodiment of a method of manufacturing a semiconductor device, it is suggested that the raw-material solution to form the semiconductor layer contains gallium.

Furthermore, according to an embodiment of a semiconductor device of a present inventive subject matter, the raw-material solution to form the first semiconductor layer contains gallium and further contains aluminum.

According to an embodiment of a present inventive subject matter, the raw material solution may be preferably a solution of the metal dissolved in the form of a complex or salt in an organic solvent or water. Also, according to an embodiment of a present inventive subject matter, the metal may be in the form of a complex or salt dispersed in an organic solvent or water. Examples of the form of the complex include an acetylacetonato complex, a carbonyl complex, an amine complex, and a hydrido complex. Examples of the form of the salt include organic metal salt (e.g., metal acetate salt, metal oxalate salt, metal citrate salt, etc.), metal sulfide salt, metal nitrate salt, metal phosphate salt, and a metal halide salt (e.g., metal chloride salt, metal bromide salt, and metal iodide salt).

In the raw-material solution, an additive may be preferably mixed. The additive may be a hydrohalic acid and/or an oxidant. Examples of the hydrohalic acid include hydrobromic acid, hydrochloric acid, and hydroiodic acid, and among all, hydrobromic acid or hydroiodic acid is preferable for the reason of obtaining a layer (film) of better quality. Examples of the oxidant include a peroxide and an organic peroxide. Examples of the peroxide include hydrogen peroxide ($H_2O_2$), sodium peroxide ($Na_2O_2$), barium peroxide ($BaO_2$), and benzoyl peroxide ($(C_6H_5CO)_2O_2$), hypochlorous acid (HClO); perchloric acid; nitric acid; and ozone water. Also, examples of the organic peroxides include peracetic acid and nitrobenzene.

Also, according to an embodiment of a present inventive subject matter, a raw material solution may contain a dopant. It is possible to form a semiconductor layer with a dopant being entirely doped from droplets of the raw material solution containing a dopant by use of a mist CVD method. Examples of n-type dopant include tin, germanium, silicon, titanium, zirconium, hafnium, vanadium and niobium. Examples of p-type dopant include magnesium, calcium, and zinc. The dopant concentration in general may be in a range of $1\times10^{16}/cm^3$ to $1\times10^{22}/cm^3$. The dopant concentration may be at a lower concentration of, for example, approximately $1\times10^{17}/cm^3$ or less, also the dopant concentration may be at a high concentration of, for example, $1\times10^{20}/cm^3$ or more. According to an embodiment of a present inventive subject matter, the dopant concentration may be preferably $1\times10^{20}/cm^3$ or more.

According to an embodiment of a present inventive subject matter, a solvent of the raw material solution is not particularly limited and may be an inorganic solvent including water. Also, according to an embodiment, a solvent of the raw material solution may be an organic solvent including alcohol. Furthermore, according to an embodiment of a present inventive subject matter, a mixed solvent of the inorganic solvent and the organic solvent may be used.

According to embodiments of a present inventive subject matter, a solvent of the raw material solution preferably contains water, and a mixed solvent of water and alcohol is further preferably used.

(Carrying Atomized Droplets into a Film-formation Chamber)

Atomized droplets floating in the space of a container for forming atomized droplets are carried into a film-formation chamber by a carrier gas. The carrier gas is not limited as long as an object of the present inventive subject matter is not interfered with, and thus, examples of the carrier gas may be an inert gas such as nitrogen and argon, may be an oxidizing gas such as oxygen and ozone, and may be a reducing gas such as a hydrogen gas and a forming gas. One or more carrier gas of the examples may be used, and a dilution gas at a reduced flow rate (e.g., 10-fold dilution gas) may be used as a second carrier gas. Also, the carrier gas may be supplied from one or more locations. While the flow rate of the carrier gas is not particularly limited, the flow rate of the carrier gas may be in a range of 0.01 to 20 L/min. According to an embodiment of a present inventive subject matter, the flow rate of the carrier gas may be preferably in a range of 1 to 10 L/min. When a dilution gas is used, the flow rate of the dilution gas is preferably in a range of 0.001 to 2 L/min, and further preferably in a range of 0.1 to 1 L/min.

(Forming a Semiconductor Layer)

For forming a semiconductor layer, the atomized droplets carried into the film-formation chamber by carrier gas are thermally reacted (through "thermal reaction") to form a semiconductor layer on a surface of a base. Herein, "thermal reaction" covers as long as the atomized droplets react by heat, and thus, the term "thermal reaction" herein may include a chemical reaction, and/or a physical reaction. The "thermal reaction" herein may include another reaction, and conditions of reaction are not particularly limited as long as an object of a present inventive subject matter is not interfered with. According to embodiments of a present inventive subject matter, the thermal reaction is conducted at an evaporation temperature or higher temperatures of the evaporation temperature of the solvent of the raw material solution, however, the temperature range for the "thermal reaction" is not too high and may be below 1000° C., for example. The thermal reaction is preferably conducted at a temperature below 650° C., and most preferably conducted at a temperature in a range of 350° C. to 600° C. Also, the thermal reaction may be conducted in any atmosphere and not particularly limited as long as an object of the present inventive subject matter is not interfered with. The thermal reaction may be conducted under a vacuum, a non-oxygen atmosphere, a reducing-gas atmosphere, and an oxidizing-gas atmosphere, however, according to embodiments of a present inventive subject matter, the thermal reaction is preferably conducted under an atmospheric pressure. Also, the thickness of the semiconductor layer is able to be set by adjusting a film-formation time.

In an embodiment of a method of manufacturing a semiconductor device, the method may include annealing a semiconductor layer. The temperature of annealing a semiconductor layer is not particularly limited as long as an object of a present inventive subject matter is not interfered with. The temperature of annealing may be in a range of 300° C. to 900° C. Also, the processing time of annealing may be in a range of one minute to 48 hours. The processing time of annealing is preferably in a range of ten minutes to 24 hours. Also, the processing time of annealing is further preferably in a range of 30 minutes to 12 hours. The processing of annealing may be conducted in any atmosphere and not particularly limited as long as an object of the present inventive subject matter is not interfered with. Accordingly, the processing of annealing may be conducted under a vacuum, under a non-oxygen atmosphere, under a nitrogen atmosphere, or under an atmospheric pressure, for example.

As mentioned above, a semiconductor layer is able to be obtained on the base.

Also, according to an embodiment of a method manufacturing a semiconductor device, the second semiconductor layer may be formed on the base, and the second semiconductor layer may be formed on the first semiconductor layer.

According to an embodiment of a method of manufacturing a semiconductor device, the first semiconductor layer may be formed on the base, and the second semiconductor layer may be formed on the first semiconductor layer. The first semiconductor layer may be preferably formed as an electron-supply layer, and the second semiconductor layer may be preferably formed as an electron-transit layer on the first semiconductor layer.

The first semiconductor crystal contained in the first semiconductor layer is not particularly limited as long as the first semiconductor crystal has a metastable crystal structure, however, the metastable crystal structure is preferably a trigonal crystal structure or a hexagonal crystal structure according to embodiments of a semiconductor device of a present inventive subject matter. The term "metastable crystal structure" herein include two or more phases except the phase that is thermodynamically the most stable at a highest temperature. For example, if the first semiconductor crystal of the first semiconductor layer contains gallium oxide, examples of the metastable crystal structure include an α-phase crystal structure, a γ-phase crystal structure, a δ-phase crystal structure, and a ε-phase crystal structure except a β-phase crystal structure that is thermodynamically the most stable at a highest temperature.

According to an embodiment of a semiconductor device of a present inventive subject matter, the first semiconductor crystal contained in the first semiconductor layer may contain at least one selected from gallium, aluminum, and indium.

Also, according to an embodiment of a semiconductor device of a present inventive subject matter, the semiconductor device includes a first semiconductor layer containing as a major component a first semiconductor crystal with a metastable crystal structure; and a second semiconductor layer containing as a major component a second semiconductor crystal with a hexagonal crystal structure. The first semiconductor crystal contained in the first semiconductor layer is different from the second semiconductor crystal contained in the second semiconductor layer in composition. The first semiconductor crystal contained in the first semiconductor layer preferably contains gallium. Furthermore, if the first semiconductor crystal contained in the first semiconductor layer further contains aluminum, the semiconductor device is expected to be thermally more stable and suitable as a semiconductor device requiring a high-frequency characteristic.

In embodiments of a semiconductor device of a present inventive subject matter, the first semiconductor crystal contained as a major component in the first semiconductor layer is preferably a crystalline oxide semiconductor.

The second semiconductor crystal contained as a major component in the second semiconductor layer is not particularly limited as long as the second semiconductor crystal is different in composition from the first semiconductor crystal and has a hexagonal crystal structure, however, the second semiconductor crystal preferably contains gallium.

According to an embodiment of a semiconductor device of a present inventive subject matter, the second semiconductor crystal contained as a major component in the second semiconductor layer preferably contains $\varepsilon\text{-}Ga_2O_3$.

Also, according to an embodiment of a semiconductor device of a present inventive subject matter, the second semiconductor crystal contained as a major component in the second semiconductor layer preferably contains a mixed crystal of $\varepsilon\text{-}Ga_2O_3$.

Herein, if the second semiconductor crystal contained as a major component in the second semiconductor layer contains $\varepsilon\text{-}Ga_2O_3$, the term "major component" means that $\varepsilon\text{-}Ga_2O_3$ is contained in the second semiconductor layer such that the atomic ratio of gallium in all of metal elements contained in the second semiconductor layer is 0.5 or more. In embodiments of a semiconductor device of a present inventive subject matter, the atomic ratio of gallium in all of metal elements contained in a second semiconductor layer is preferably 0.7 or more, and further preferably 0.8 or more.

Also, according to an embodiment of a present inventive subject matter, the buffer layer may be used as at least a part of the first semiconductor layer. Accordingly, the buffer layer may be used as an electron-supply layer.

Furthermore, according to an embodiment of a present inventive subject matter, the buffer layer may be used as at least a part of the second semiconductor layer, or as at least a part of the second semiconductor layer. Accordingly, the buffer layer may be used as an electron-transit layer.

Also, according to an embodiment of a semiconductor device of a present inventive subject matter, the first semiconductor layer may be used as an electron-supply layer. Also, the second semiconductor layer may be used as an electron-transit layer. It is possible to use the semiconductor layer after being treated by a known treatment. Examples of the known treatment include cleaning, polishing, etching, and separating to obtain a necessary portion as a semiconductor layer.

According to the method mentioned above, it is possible to obtain a semiconductor device includes a first semiconductor layer containing as a major component a first semiconductor crystal with a metastable crystal structure; and a second semiconductor layer containing as a major component a second semiconductor crystal with a hexagonal crystal structure. The first semiconductor crystal contained in the first semiconductor layer is different in composition from the second semiconductor crystal contained in the second semiconductor layer. The first semiconductor layer includes an electron-supply layer. The second semiconductor layer includes an electron-transit layer.

The first semiconductor crystal contained as a major component in the first semiconductor layer is not particularly limited as long as the first semiconductor crystal has a metastable crystal structure, however, the metastable crystal structure is preferably a trigonal crystal structure or a hexagonal crystal structure. Also, the first semiconductor crystal preferably contains gallium. The first semiconductor crystal farther contains aluminum, the semiconductor device is expected to be thermally more stable and suitable as a semiconductor device requiring a high-frequency characteristic. Herein, if the second semiconductor crystal contained as a major component in the second semiconductor layer contains $\varepsilon\text{-}Ga_2O_3$, the term "major component" means that $\varepsilon\text{-}Ga_2O_3$ is contained in the second semiconductor layer such that the atomic ratio of gallium in all of metal elements contained in the second semiconductor layer is 0.5 or more. In embodiments of a semiconductor device of a present inventive subject matter, the atomic ratio of gallium in all of metal elements contained in a second semiconductor layer is preferably 0.7 or more, and further preferably 0.8 or more.

The first semiconductor crystal may be a single crystal. Also, the first semiconductor crystal may be a polycrystal. According to an embodiment of a present inventive subject matter, the first semiconductor crystal is preferably a single crystal. Also, the band gap of the first semiconductor layer preferably differs from the band gap of the second semiconductor layer, and the band gap of the first semiconductor layer is preferably higher than the band gap of the second semiconductor layer, according to an embodiment of a semiconductor device of a present inventive subject matter. The thickness of the first semiconductor layer and the thickness of the second semiconductor layer are not particularly limited. The thickness of the first semiconductor layer may be 1 μm or less and also 1 μm or more, and the thickness of the second semiconductor layer may be 1 μm or less and also 1 μm or more. However, according to an embodiment of a semiconductor device of a present inventive subject matter, the electron-supply layer is preferably thinner than the electron-transit layer. The first semiconductor layer may be a single layer. Also, the first semiconductor layer may include two or more layers. The second semiconductor layer may be a single layer. Also, the second semiconductor layer may include two or more layers. A surface area of the first semiconductor layer and a surface area of the second semiconductor layer are not particularly limited, however, the surface area of the first semiconductor layer is preferably 1 $mm^2$ or less and the surface area of the second semiconductor layer is preferably 1 $mm^2$ or less. According to an embodiment of a semiconductor device of a present inventive subject matter, the surface area of the first semiconductor layer is preferably 1 mm square and the surface area of the second semiconductor layer is further preferably 1 mm square, since it is possible to obtain a semiconductor device with a high-frequency characteristic and a high-voltage resistance.

Also, according to an embodiment of a method of manufacturing a semiconductor device, the method includes: forming a first semiconductor layer containing as a major component a first semiconductor crystal with a metastable crystal structure; and forming a second semiconductor layer containing as a major component a second semiconductor crystal with a hexagonal crystal structure on the first semiconductor layer. The second semiconductor crystal that is different from the first semiconductor crystal in composition. Also, the first semiconductor layer includes a step terrace structure. The term "step terrace structure" herein means a structure in which a step includes a flat surface (terrace) that is atomically flat and/or molecularly flat. Examples of the step include a single atom step and a single molecule step. A step terrace structure on a surface of the first semiconductor layer may be formed by a known method. For example, a semiconductor layer without a step terrace structure may be annealed to obtain a step terrace structure. An annealing temperature is not particularly limited as long as the annealing temperature is in a range of temperatures at which the first semiconductor layer with the metastable crystal structure is stable.

If the first semiconductor layer containing the first semiconductor crystal as a major component and the first semiconductor crystal contains gallium and aluminum, the annealing temperature is preferably 800° C. or higher.

By forming a second semiconductor layer on a first semiconductor layer with a step terrace structure, it is possible to manufacture a semiconductor device by use of a sapphire substrate that is commercially available. Also, it is possible to manufacture a semiconductor device by use of a film-formation apparatus, which does not require a vacuum. Accordingly, it is possible to obtain a semiconductor device cost-effectively. A film-formation apparatus to form a second semiconductor layer is not particularly limited and a known apparatus such as a physical vapor deposition (PVD) apparatus may be used, however, according to an embodiment of a method of manufacturing a semiconductor device of a present inventive subject matter, a mist chemical vapor deposition (CVD) apparatus is preferably used.

According to an embodiment of a semiconductor device of a present inventive subject matter, the electron-supply layer may be doped with a dopant. The dopant is not particularly limited and the electron-supply layer may contain a known dopant. Examples of n-type dopant include tin, germanium, silicon, titanium, zirconium, hafnium, vanadium and niobium. Examples of p-type dopant include magnesium, calcium and zinc.

Also, it is noted that impurities may be contained in the electron-supply layer during a film-formation process, for example, and may function as a dopant. Content of dopant in composition of the electron-supply layer may be preferably 0.00001 atom % or more. Content of dopant in composition of the electron-supply layer may be preferably in a range of 0.00001 atom % to 20 atom %. Content of dopant in composition of the electron-supply layer may be further preferably in a range of 0.00001 atom % to 10 atom %. The electron-supply layer has a carrier concentration, which is able to be set by setting the quantity of dopant to be doped.

The electron-transit layer may be doped with a dopant similarly to the electron-supply layer, however, according to embodiments of a semiconductor device of a present inventive subject matter, the electron-transit layer is preferably not doped with a dopant.

Semiconductor devices may be categorized as planar semiconductor devices and also as vertical semiconductor devices. Also, semiconductor devices according to embodiments of a present inventive subject matter are suitably used for both planar semiconductor devices and vertical semiconductor devices. For example, according to an embodiment of a present inventive subject matter, a semiconductor device includes a first semiconductor layer, a second semiconductor layer, a first electrode, and a second electrode. The first electrode and the second electrode are in a planar arrangement at one side of the layered structure as a planar semiconductor device.

Furthermore, according to an embodiment of a present inventive subject matter, a semiconductor device includes a first semiconductor layer, a second semiconductor layer arranged on the first semiconductor layer as a layered structure, a first electrode arranged at a first side of the layered structure and a second electrode arranged at a second side opposite to the first side of the layered structure as a vertical semiconductor device. The semiconductor devices according to embodiments of a present inventive subject matter preferably utilize a high-frequency characteristic. The semiconductor devices according to embodiments of a present inventive subject matter are expected to be next generation switching devices to achieve high voltage, low loss, and high heat resistance, and are expected to be applied to power semiconductor devices (power devices) including a Schottky barrier diode (SBD), a metal-oxide-semiconductor field-effect transistor (MOSFET), JFET, a high-electron-mobility transistors (HEMT) or a heterojunction bipolar transistor (HBT). Examples of semiconductor devices utilizing high-frequency properties include a high-electron-mobility transistor (HEMT) and a heterojunction bipolar transistor (HBT). For example, HEMTs are able to be used in various systems including a parabolic antenna, a radar system, a car navigation system, and a base station for mobile devices such as mobile phones, smartphones, and wearable devices, for example.

According to an embodiment of a semiconductor device of a present inventive subject matter, a HEMT is explained as follows, however a semiconductor device of a present inventive subject matter is not limited thereto. The semiconductor device may include an additional layer. Examples of the additional layer include an insulation layer, a semi-insulation layer, an electrically-conductive layer, a semiconductor layer, a buffer layer, and an intermediate layer. Also, it is possible to prepare a semiconductor device without using a buffer layer, for example.

(HEMT)

Figure 2:
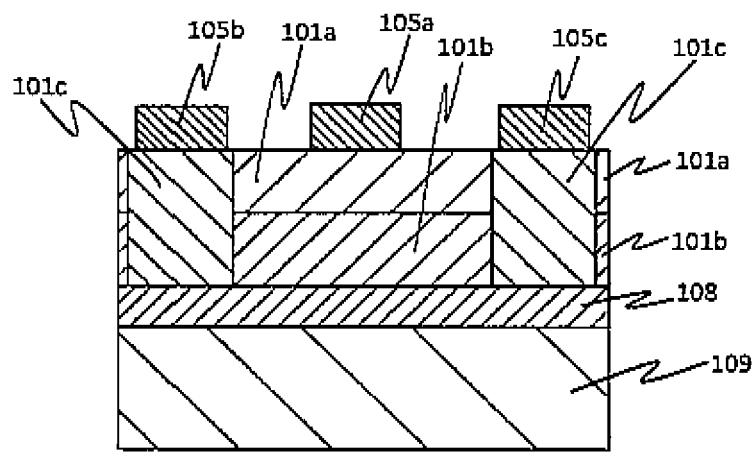
FIG. 2 shows a schematic cross-sectional view of a semiconductor device of an embodiment according to a present inventive subject matter.

FIG. 2 shows a schematic cross-sectional view of a semiconductor device. The semiconductor device of this embodiment is a high-electron-mobility transistor (HEMT), for example. A semiconductor device includes a first semiconductor layer 101a and a second semiconductor layer 101b. The first semiconductor layer 101a is arranged on the second semiconductor layer 121b. The first semiconductor layer 101a contains a first semiconductor crystal with a metastable crystal structure. The second semiconductor layer 101b contains a second semiconductor crystal with a hexagonal crystal structure. The first semiconductor crystal contained in the first semiconductor layer 101a is different in composition from the second semiconductor crystal contained in the second semiconductor layer 101b. The second semiconductor layer 101b contains an ε-phase crystalline oxide semiconductor with a second composition that is different from the first composition of the first semiconductor layer 101a. For example, the first semiconductor layer 101a is an n-type semiconductor layer with a first bandgap. The second semiconductor layer 101b is an n-type semiconductor layer with a second bandgap. The first bandgap is wider than the second bandgap of the second semiconductor layer 101b. The semiconductor device may include three or more layers including the first semiconductor layer 101a and the second semiconductor layer 101b. The three or more layers of the semiconductor device may further include a third layer 108. The third layer 108 may be a buffer layer. The three or more layers of the layered structure 12 of the semiconductor device 100 may further include a semi-insulating layer 109 positioned under the buffer layer 108. Also, the semiconductor device may further include a gate electrode 125a, a source electrode 125b, and a drain electrode 125c arranged at one side of the semiconductor device. The layered structure 12 may further include an n+ type semiconductor layer 101c positioned in the first semiconductor layer 101a and the second semiconductor layer 101b.

Materials for each electrode may be known electrode materials. Examples of such an electrode material include metal, such as aluminum (Al), molybdenum (Mo), cobalt (Co), zirconium (Zr), tin (Sn), niobium (Nb), iron (Fe), Cr (chromium), Ta (tantalum), Ti (titanium), Au (gold), Pt (platinum), V (vanadium), Mn (manganese), Ni (nickel), Cu (copper), Hf (hafnium), W (tungsten), Ir (Iridium), Zn (zinc), In (indium), Pd (palladium), Nd (neodymium), and/or Ag (silver), and an alloy containing at least two metals selected from among Al, Mo, Co, Zr, Sn, Nb, Fe, Cr, Ta, Ti, Au, Pt, V, Mn, Ni, Cu, Hf W, Ir, Zn, In, Pd, Nd, and Ag. Also, examples of the electrode material further include metal oxide conductive films, such as a tin oxide film, a zinc oxide film, an indium oxide film, an indium tin oxide (ITO), and an indium zinc oxide (IZO), organic conductive compounds, such as polyaniline, polythiophene, and polypyrrole, and mixtures of at least two selected from among the examples.

The electrodes may be formed by a known method, such as vacuum deposition, sputtering, and printing for example.

In this embodiment, the n+ type semiconductor layer 101c positioned in the first semiconductor layer 101a and the second semiconductor layer 101b is not particularly limited, however, the n+ type semiconductor layer 101c contains a major component that is the same or similar to the major component of the first semiconductor layer 101a or the second semiconductor layer 101b.

Accordingly, it is possible to obtain a semiconductor device with a high-frequency characteristic and a high-voltage resistance.

(HBT)

Figure 3:
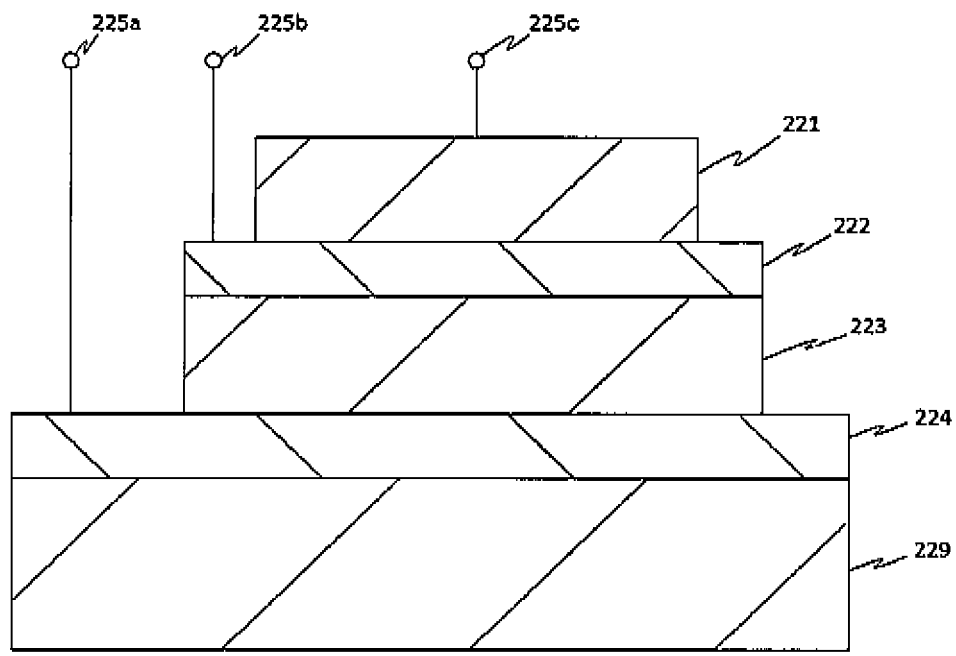
FIG. 3 shows a schematic cross-sectional view of a semiconductor device of an embodiment according to a present inventive subject matter.

FIG. 3 shows a schematic cross-sectional view of a semiconductor device of an embodiment according to a present inventive subject matter. The semiconductor device of this embodiment is a heterojunction bipolar transistor (HBT) includes an emitter layer 221, a base layer 222, and a collector layer 223. Also, as an embodiment of a semiconductor device includes a base layer 222, an emitter layer 221 arranged on a first side of the base layer 222, and a collector layer 223 arranged at a second side that is an opposite side of the first side of the base layer 222. The semiconductor device may further include a sub-collector layer 224 and the substrate 229. The semiconductor device 200 may further include an emitter electrode 225a electrically connected to the emitter layer 221, a collector electrode 225a electrically connected to the collector layer 223, and a base electrode 225b electrically connected to the base layer 222. A layered structure according to a present inventive subject matter is used as mentioned above, it is possible to obtain a semiconductor device with a high-frequency characteristic and a high-voltage resistance.

Figure 4:
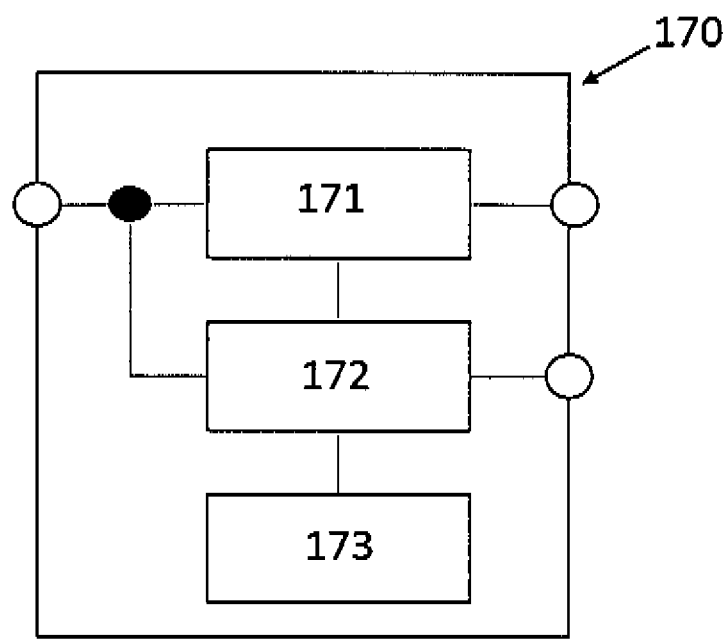
FIG. 4 shows schematic view of a semiconductor system according to an embodiment of a present inventive subject matter.

The semiconductor device according to an embodiment of a present inventive subject matter may be used in various systems including an automotive radar, an antenna, a car navigation system, and a base station system for communication, for example. Also, the semiconductor device may be used in a power system by electrically connecting the semiconductor device and a circuit board of the power system. For example, FIG. 4 shows a schematic view of a semiconductor system according to a fourth embodiment of a present inventive subject matter. The semiconductor system may be a power system 170. The power system 170 may include a semiconductor device as a power device. The semiconductor device further includes a first electrode electrically connected to the first semiconductor layer, and a second electrode electrically connected to the first semiconductor layer.

Also, the power system 170 may include two or more power devices and a control circuit. The power system 170 shown in FIG. 4 includes a first power system 171 and a second power system 172 and a control circuit 173 that are electrically connected to one another in the power system 170.

Figure 5:
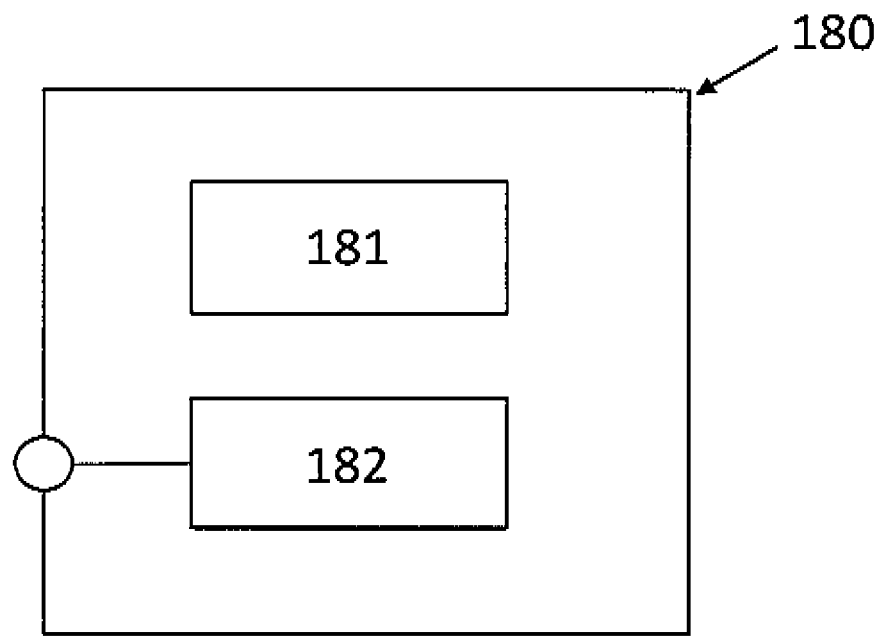
FIG. 5 shows a schematic view of a semiconductor system according to an embodiment of a present inventive subject matter.

FIG. 5 shows a schematic view of a semiconductor system according to an embodiment of a present inventive subject matter. The semiconductor system may be a system device 180, as shown in FIG. 5. The system device 180 may include a power system 181 and an electric circuit 182 that may be combined with the power system 181.

Figure 6:
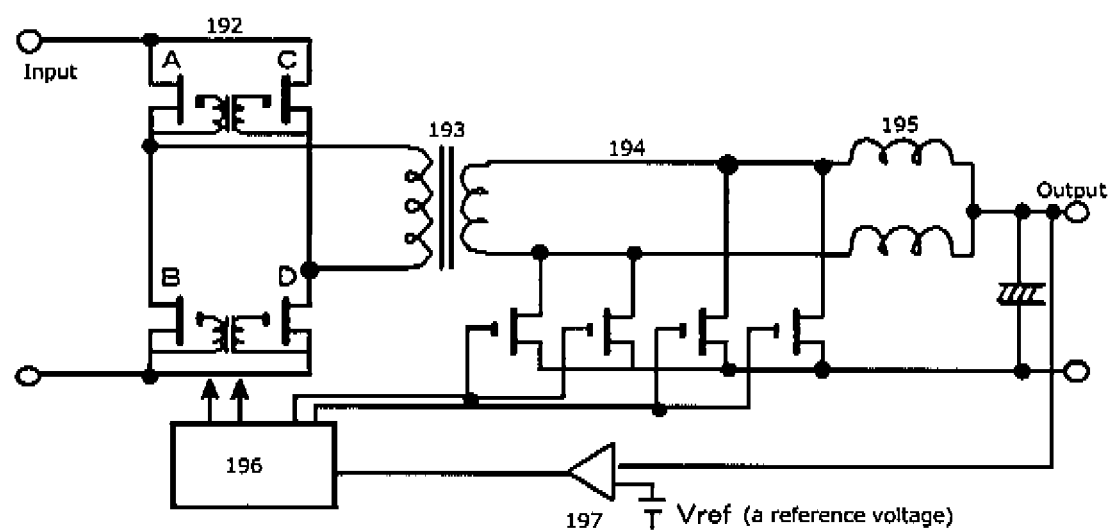
FIG. 6 shows a schematic view of a circuit diagram of power supply of a semiconductor system according to an embodiment of a present inventive subject matter.

FIG. 6 shows a schematic view of a circuit diagram of power supply of a semiconductor system according to an embodiment of a present inventive subject matter. FIG. 6 illustrates a power supply circuit 191 of a power supply device, including a power circuit and a control circuit. A DC voltage is switched at high frequencies by an inverter 192 (configured with MOSFET A to D) to be converted to AC, followed by insulation and transformation by a transformer 193. The voltage is then rectified by rectification MOSFETs 194 and then smoothed by a DCL 195 (smoothing coils L1 and L2) and a capacitor to output a direct current voltage. At this point, the output voltage is compared with a reference voltage by a voltage comparator 197 to control the inverter and the rectification MOSFETs by a PWM control circuit 196 to have a desired output voltage.

Embodiments are explained in more details.

(Practical Example 1)

1. Forming an Electron-Supply Layer 1-1. Film-Formation Apparatus

FIG. 1 shows a mist (chemical vapor deposition) CVD apparatus used in this example to form a semiconductor layer (film). It is possible to obtain a semiconductor film by separating at least a base, for example. The mist CVD apparatus 19 includes a carrier gas supply device 22a, a first flow-control valve 23a to control a flow of a carrier gas that is configured to be sent from the carrier gas supply device 22a, a diluted carrier gas supply device 22b, a second flow-control valve 23b to control a flow of a carrier gas that is configured to be sent from the diluted carrier gas supply device 22b, a mist generator 24 in that a raw material solution 24a is contained, a container 25 in that water 25a is contained, and an ultrasonic transducer that may be attached to a bottom surface of the container 25. The mist CVD apparatus 19 further includes a film-formation chamber 27 that may be a quartz tube with an inner diameter of 40 mm, a heater 28, and a stand 21 to support an object 20 in the film-formation chamber 27. The heater 28 may be arranged at a periphery of the film-formation chamber 27. A film is to be formed on the object, and the object may be a substrate. Also, the object may be a semi-insulating layer. Furthermore, the object may be a semiconductor layer. The stand 21 is made of quartz and includes a tilting surface, on which the object is placed. The tilting surface of the stand 21 may incline to a horizontal plane. The film-formation chamber 27 and the stage 21 both made of quarts tend to suppress entry of impurities originated from a material of parts and devices into a film to be formed on the object.

1-2. Preparation of Raw-Material Solution

A raw-material solution is prepared by dissolving aluminum acetylacetonate (0.09 mol/L) and gallium acetylacetonate (0.03 mol/L) into ultrapure water.

1-3. Film (Layer) Formation Preparation

The raw-material solution 24a obtained at 1-2. the Preparation of the Raw-Material Solution above was set in the container of the mist generator 24. Also, a c-plane sapphire substrate was placed on the stand 21 in a film-formation chamber 27. The heater 28 was activated to raise the temperature in the film-formation chamber 27 up to 450° C. The first flow-control valve 23a and the second flow-control valve 23b were opened to supply a carrier gas from the carrier gas device 22a and the diluted carrier gas device 22b, which are the source of carrier gas, into the film-formation chamber 27 to replace the atmosphere in the film-formation chamber 27 with the carrier gas sufficiently. After the atmosphere in the film-formation chamber 27 was sufficiently replaced with the carrier gas, the flow rate of the carrier gas from the carrier gas source 22a was regulated at 3.0 L/min. and the diluted carrier gas from the diluted carrier gas source 22b was regulated at 0.5 L/min. In this embodiment, nitrogen was used as the carrier gas.

1-4. Formation of a Film

The ultrasonic transducer 26 was then activated to vibrate at 2.4 MHz, and vibrations were propagated through the water 25a in the vessel to the raw material solution 24a to turn the raw material solution 24a into atomized droplets. The atomized droplets were introduced in the film-formation chamber 27 with the carrier gas. The film-formation chamber was heated by the heater 28 such that the temperature in the film-formation chamber was raised up to 460° C. and the atomized droplets were reacted (CVD reaction) in the film-formation chamber 27 to form a film that is an electron-supply layer on the object 20.

1-5. Evaluation

The film obtained at 1-4. was evaluated by use of the X-ray diffraction (XRD) analysis of XRD 2θ/ω scans at an angle from 15 degrees to 95 degrees. The measurement was conducted by use of CuKα radiation. The film obtained was found to be a film of $\alpha\text{-}(Al_{0.4}Ga_{0.6})_2O_3$.

2. Forming an Electron-Transit Layer

Figure 7:
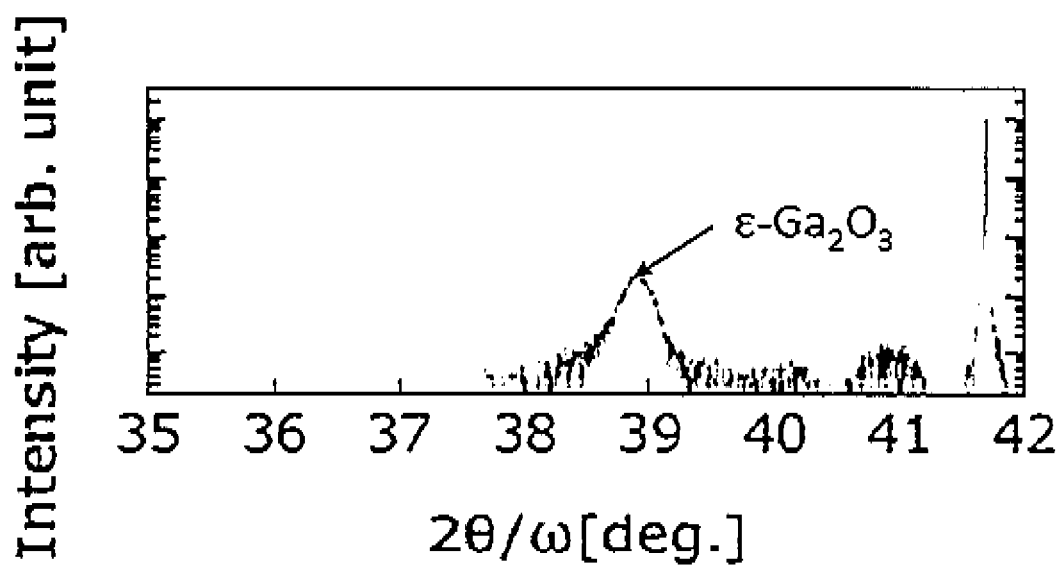
FIG. 7 shows an x-ray power diffraction (XRD) measurement result of a semiconductor layer obtained according to an embodiment of a present inventive subject matter. The horizontal axis indicates an angle of diffraction (deg.) and the vertical axis indicates an intensity of diffraction (arb. Unit).

An electron-transit layer was obtained by the same conditions as the conditions of the forming the electron-supply layer except the following three conditions: without using the aluminum acetylacetonate to prepare a raw material-solution; using gallium chloride instead of using gallium acetylacetonate; setting the temperature in the film-formation chamber to 500° C. and the atomized droplets were reacted (CVD reaction) in the film-formation chamber 27 to form a film that is an electron-transit layer on the electron-supply layer on the substrate. The electron-transit layer was evaluated by use of the X-ray diffraction (XRD) analysis of XRD 2θ/ω scans similarly to the electron-supply layer that was evaluated at 1-5. FIG. 7 shows the result. As shown in FIG. 7, The layer obtained here was found to be an $\varepsilon\text{-}Ga_2O_3$ layer. Also, the layer obtained here was observed by an electron beam diffraction image by a transmission electron microscopy (TEM) and found to be a single crystalline film in good quality.

(Practical Example 2)

An electron-supply layer was obtained by the same conditions as the conditions of the forming the electron-supply layer above except the following one condition: changing the ratio of aluminum acetylactonate and gallium acetylacetonate that are into ultrapure water to obtain the electron-supply layer that is to be a film of $\alpha\text{-}(Al_{0.17}Ga_{0.83})_2O_3$. It is suggested that the method of manufacturing a semiconductor device may further include annealing the first semiconductor layer. The electron-supply layer of $\alpha\text{-}(Al_{0.17}Ga_{0.83})_2O_3$.

Figure 8:
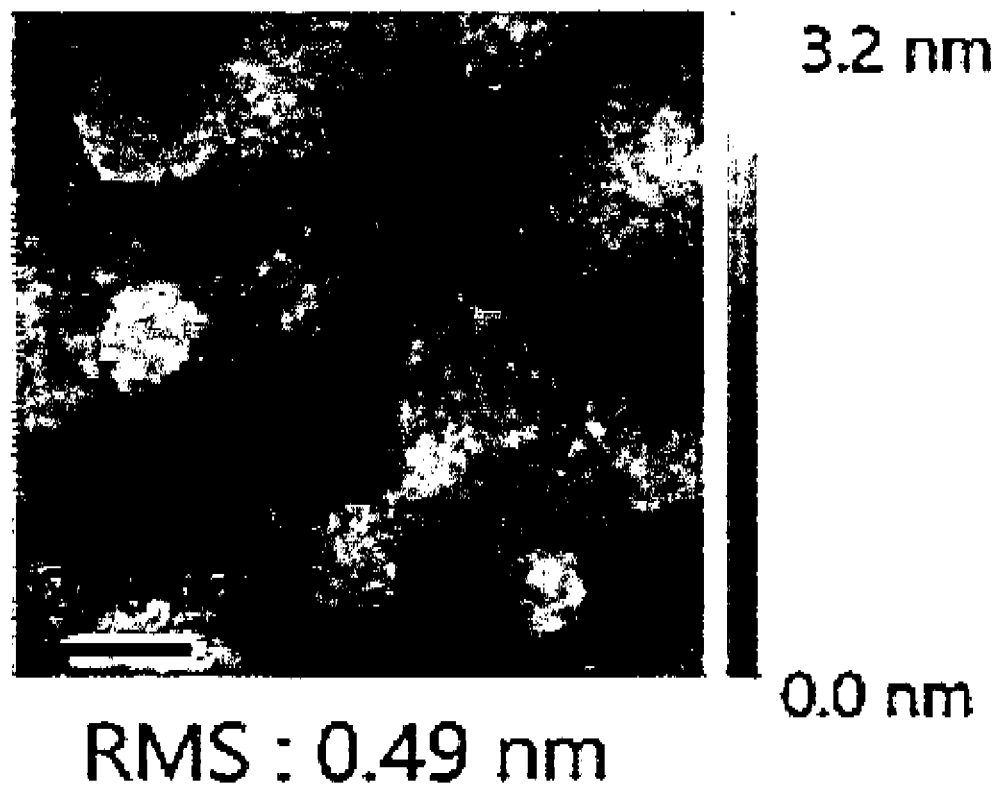
FIG. 8 shows an atomic force microscopy (AFM) observation result of a semiconductor layer obtained according to an embodiment of a present inventive subject matter.
Figure 9:
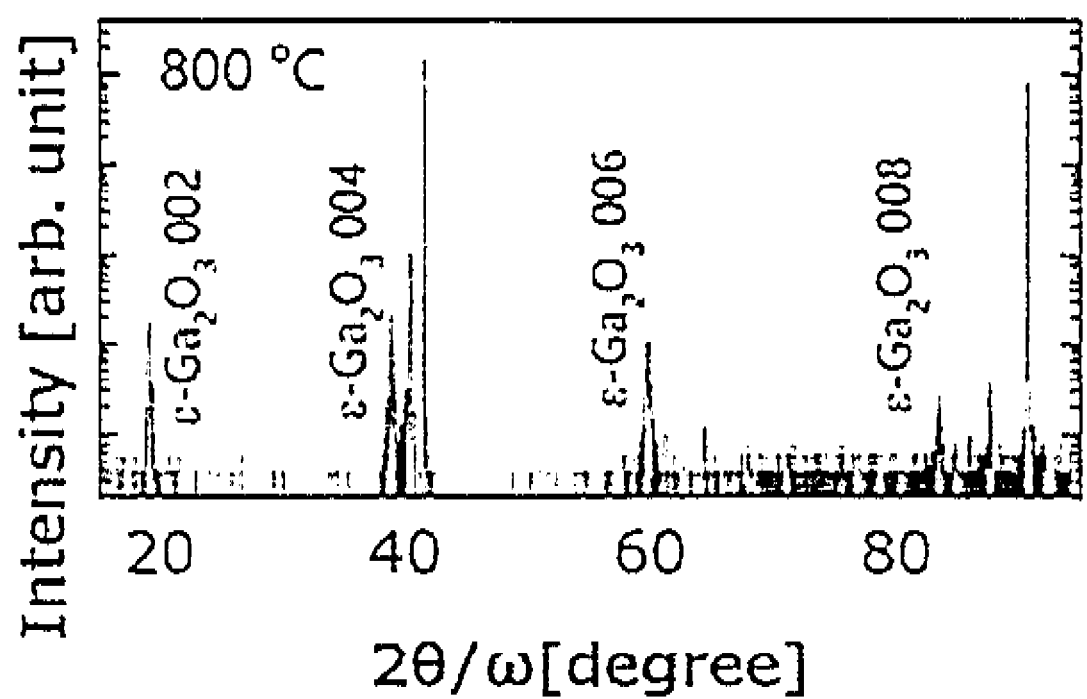
FIG. 9 shows an XRD measurement result of a semiconductor layer obtained according to an embodiment of a present inventive subject matter.

Also, it is suggested that a step terrace structure may be formed on a surface of the first semiconductor layer by the annealing the first semiconductor layer that is the electron-supply layer of $\alpha\text{-}(Al_{0.17}Ga_{0.83})_2O_3$ to form a step terrace structure on the surface of the electron-supply layer of $\alpha\text{-}(Al_{0.17}Ga_{0.83})_2O_3$ at 800° C. The step terrace structure was observed by AFM. FIG. 8 shows the AFM image.

Furthermore, an electron-transit layer was obtained by the same conditions as the conditions of the forming the electron-transit layer at 2. Forming an electron-transit layer above except the following one condition: the electron-transit was formed on the electron-supply layer of $\alpha\text{-}(Al_{0.17}Ga_{0.83})_2O_3$ on the substrate. The electron-transit layer was evaluated by use of the X-ray diffraction (XRD) analysis of XRD 2θ/ω scans similarly to the electron-supply layer that was evaluated at 1-5. FTG. 9 shows the result, and found to be an $\varepsilon\text{-}Ga_2O_3$ layer as an electro-transit layer.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

A crystalline film according to an embodiment of a present inventive subject matter is able to be used in various devices including semiconductor devices, power devices including inverters, electronic devices, optical devices, power sources and power systems.

REFERENCE NUMBER DESCRIPTION 19 a mist CVD apparatus
20 an object on which a film is to be formed
21 a stand to support an object
22a a carrier gas supply device
22b a dilution carrier gas supply device
23a a flow-control valve of carrier gas
23b a flow-control valve of dilution carrier gas
24 a mist generator
24a a raw material solution
25 a container
25a water
26 an ultrasonic transducer
27 a film-formation chamber
28 a heater
101a a first n type semiconductor layer with a first bandgap
101b a second n type semiconductor layer with a second bandgap smaller than the first bandgap
101c an n+ type semiconductor layer
105a a gate electrode
105b a source electrode
105c a drain electrode
108 a buffer layer
109 a semi-insulating layer
221 an emitter layer
222 a base layer
223 a collector layer
224 a sub-collector layer
225a a collector electrode
225b a base electrode
225c an emitter electrode
229 a substrate

What is claimed is:

1. A semiconductor device comprising:
a first semiconductor layer that is an electron-supply layer comprising as a major component a first semiconductor crystal with a metastable crystal structure; and
a second semiconductor layer that is an electron-transit layer comprising as a major component a second semiconductor crystal with a hexagonal crystal structure,
the first semiconductor crystal comprised in the first semiconductor layer being different in composition from the second semiconductor crystal comprised in the second semiconductor layer.

2. The semiconductor device of claim 1, wherein the metastable crystal structure of the first semiconductor crystal comprised in the first semiconductor layer is a trigonal crystal structure.

3. The semiconductor device of claim 1, wherein the metastable crystal structure of the first semiconductor crystal comprised in the first semiconductor layer is a hexagonal crystal structure.

4. The semiconductor device of claim 1, wherein the first semiconductor crystal comprised in the first semiconductor layer comprises gallium.

5. The semiconductor device of claim 4, wherein the first semiconductor crystal comprised in the first semiconductor layer further comprises aluminum.

6. The semiconductor device of claim 1, wherein the second semiconductor crystal comprised in the second semiconductor layer comprises gallium.

7. The semiconductor device of claim 1, wherein the second semiconductor crystal comprised in the second semiconductor layer comprises gallium.

8. The semiconductor device of claim 1, wherein the second semiconductor crystal comprised in the second semiconductor layer comprises a mixed crystal comprising $\varepsilon$-$Ga_2O_3$.

9. The semiconductor device of claim 1 further comprising:
a first electrode electrically connected to the first semiconductor layer; and
a second electrode electrically connected to the first semiconductor layer,
the semiconductor device being a power device.

10. The semiconductor device of claim 1, wherein the semiconductor device is a high frequency device.

11. The semiconductor device of claim 1, wherein the second semiconductor crystal comprised in the second semiconductor layer comprises gallium.

12. The semiconductor device of claim 1, wherein the second semiconductor crystal comprised in the second semiconductor layer comprises $\varepsilon$-$Ga_2O_3$.

13. A system comprising:
a semiconductor device of claim 1.

14. A method of manufacturing a semiconductor device comprising:
forming a first semiconductor layer that is to be an electron-supply layer comprising as a major component a first semiconductor crystal with a metastable crystal structure by use of a mist chemical vapor deposition method; and
forming a second semiconductor layer that is to be an electron-transit layer comprising as a major component a second semiconductor crystal with a hexagonal crystal structure by use of the mist chemical vapor deposition method, the second semiconductor crystal that is different from the first semiconductor crystal in composition.

15. A method of manufacturing a semiconductor device comprising:
forming a first semiconductor layer that is to be an electron-supply layer comprising as a major component a first semiconductor crystal with a metastable crystal structure; and
forming a second semiconductor layer that is to be an electron-transit layer comprising as a major component a second semiconductor crystal with a hexagonal crystal structure on the first semiconductor layer.

16. The method of claim 15 further comprising:
annealing the first semiconductor layer.

17. The method of claim 16, wherein a step terrace structure is formed on a surface of the first semiconductor layer by the annealing the first semiconductor layer.

18. The method of claim 15, wherein the metastable crystal structure of the first semiconductor layer comprises a trigonal crystal structure or a hexagonal crystal structure.

* * * * *